(12) United States Patent
Shih

(10) Patent No.: US 8,314,501 B2
(45) Date of Patent: Nov. 20, 2012

(54) SEMICONDUCTOR CHIP PACKAGE STRUCTURE, SEMICONDUCTOR CHIP AND SEMICONDUCTOR CHIP GROUP

(75) Inventor: Ping-Chia Shih, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 90 days.

(21) Appl. No.: 13/026,419

(22) Filed: Feb. 14, 2011

(65) Prior Publication Data

US 2012/0205794 A1 Aug. 16, 2012

(51) Int. Cl.
*H01L 23/48* (2006.01)
*H01L 23/00* (2006.01)
*H01L 23/488* (2006.01)

(52) U.S. Cl. ............ 257/784; 257/E23.001; 257/E23.01; 257/E23.141; 257/737; 257/782; 257/738; 257/778

(58) Field of Classification Search .................. 257/784, 257/E23.141, 737, 734, 738, 778, E23.001, 257/E23.01, 782
See application file for complete search history.

(56) References Cited

U.S. PATENT DOCUMENTS

| 7,696,066 | B2 | 4/2010 | Liu | |
|---|---|---|---|---|
| 7,829,438 | B2* | 11/2010 | Haba et al. | 438/462 |
| 2008/0122039 | A1 | 5/2008 | Liu | |
| 2011/0187007 | A1* | 8/2011 | Haba et al. | 257/784 |

FOREIGN PATENT DOCUMENTS

TW    I264124    9/2006

\* cited by examiner

*Primary Examiner* — A O Williams
(74) *Attorney, Agent, or Firm* — Ding Yu Tan

(57) ABSTRACT

A semiconductor chip package structure including a first semiconductor chip, a second semiconductor chip and a supporting substrate is provided. The first semiconductor chip includes at least a first conductor unit. The first conductor unit has a first bonding surface and a second bonding surface exposed from the first semiconductor chip. The second semiconductor chip includes at least a second conductor unit. The second conductor unit has a third bonding surface and a fourth bonding surface exposed from the second semiconductor chip. The third bonding surface is contacted with and electrically connected to the first bonding surface. The supporting substrate includes a wire unit for electrically connecting to at least one of the second bonding surface and the fourth bonding surface. A semiconductor chip and a semiconductor chip group are also provided.

13 Claims, 5 Drawing Sheets ary skilled
SEMICONDUCTOR CHIP PACKAGE STRUCTURE, SEMICONDUCTOR CHIP AND SEMICONDUCTOR CHIP GROUP

FIELD OF THE INVENTION

The present invention relates to a semiconductor package, and particularly to a semiconductor chip package structure and a semiconductor chip for the semiconductor chip package structure.

BACKGROUND OF THE INVENTION

Through silicon via (TSV) technology is developed to achieve a 3-dimensional package of a semiconductor chip. Currently, the through silicon via technology is mainly applied to package a memory semiconductor chip. A number of memory dies manufactured by the same process and the same standard are stacked together by using the through silicon via technology. However, in a traditional method of forming the through silicon via, it is necessary to perform a thinning process to greatly reduce a thickness of the silicon substrate where an integrated circuit has been formed. For example, the thickness of the silicon substrate is reduced from 800 micrometers to 50 micrometers. The thinning process of the silicon substrate is difficult and is prone to damage the integrated circuit on the silicon substrate. In addition, if the memory dies are manufactured by the different processes and the different standards, the memory dies will have different sizes. Thus, it is difficult to stack the memory dies with different sizes by using the through silicon via technology.

Therefore, what is needed is a semiconductor chip package structure and a semiconductor chip for the semiconductor chip package structure to overcome the above disadvantages.

SUMMARY OF THE INVENTION

The present invention provides a semiconductor chip package structure, which is simple and can facilitate packaging a number of semiconductor chips, thereby achieving 3-dimensional package easily.

The present invention provides a semiconductor chip, which can be packaged easily, thereby achieving 3-dimensional package.

The present invention provides a semiconductor chip group, which can be cut to form a semiconductor chip that can be packaged easily, thereby achieving 3-dimensional package.

The present invention provides a semiconductor chip package structure including a first semiconductor chip, a second semiconductor chip and a supporting substrate. The first semiconductor chip includes at least a first conductor unit. The first conductor unit has a first bonding surface and a second bonding surface. The first bonding surface and the second bonding surface are exposed from the first semiconductor chip. The second semiconductor chip includes at least a second conductor unit. The second conductor unit has a third bonding surface and a fourth bonding surface. The third bonding surface and the fourth bonding surface are exposed from the second semiconductor chip. The third bonding surface is contacted with and electrically connected to the first bonding surface of the first conductor unit of the first semiconductor chip. The supporting substrate includes a wire unit. The wire unit is configured for electrically connecting to at least one of the second bonding surface and the fourth bonding surface.

In one embodiment of the present invention, the first semiconductor chip and the second semiconductor chip are selected from a group consisting of a memory chip, a logic circuit chip and a light emitting diode chip.

In one embodiment of the present invention, the first semiconductor chip includes a first surface and a second surface adjacent to and perpendicular to the first surface. The first bonding surface and the second bonding surface are respectively exposed from the first surface and the second surface. The second semiconductor chip includes a third surface and a fourth surface adjacent to and perpendicular to the third surface. The third bonding surface and the fourth bonding surface are respectively exposed from the third surface and the fourth surface.

In one embodiment of the present invention, the first conductor unit is protruded from the second surface of the first semiconductor chip, and the second conductor unit is protruded from the fourth surface of the second semiconductor chip.

In one embodiment of the present invention, the first semiconductor chip includes a first substrate and a first component layer disposed on the first substrate. The first conductor unit is disposed in the first component layer. The second semiconductor chip includes a second substrate and a second component layer disposed on the second substrate. The second conductor unit is disposed in the second component layer.

In one embodiment of the present invention, the supporting substrate is a silicon substrate.

In one embodiment of the present invention, the second bonding surface and the fourth bonding surface form a bonding pad surface, and the bonding pad surface is soldered with and electrically connected to the wire unit.

The present invention further provides a semiconductor chip including a substrate, a component layer disposed on the substrate and a conductor unit disposed in the component layer. The component layer has a first surface and a second surface adjacent to the first surface. The conductor unit has a first bonding surface exposed from the first surface and the second bonding surface exposed from the second surface.

In one embodiment of the present invention, the first surface is perpendicular to the second surface.

In one embodiment of the present invention, the semiconductor chip is selected from a group consisting of a memory chip, a logic circuit chip and a light emitting diode chip.

In one embodiment of the present invention, the first bonding surface is adjacent to the second bonding surface.

In one embodiment of the present invention, the conductor unit is protruded from the second surface.

In one embodiment of the present invention, the semiconductor chip further includes a sealing ring disposed in the component layer and located between the conductor unit and the substrate.

The present invention still further provides a semiconductor chip including a substrate, a component layer disposed on the substrate and at least a plurality of conductor units disposed in the component layer. The component layer has a first surface, and a plurality of notch regions are defined on the first surface. The conductor units are exposed from the first surface. Each of the conductor unit has a first bonding surface. A portion of each of the conductor units is located in the corresponding notch region.

In one embodiment of the present invention, each of the conductor units traverses the corresponding notch region.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
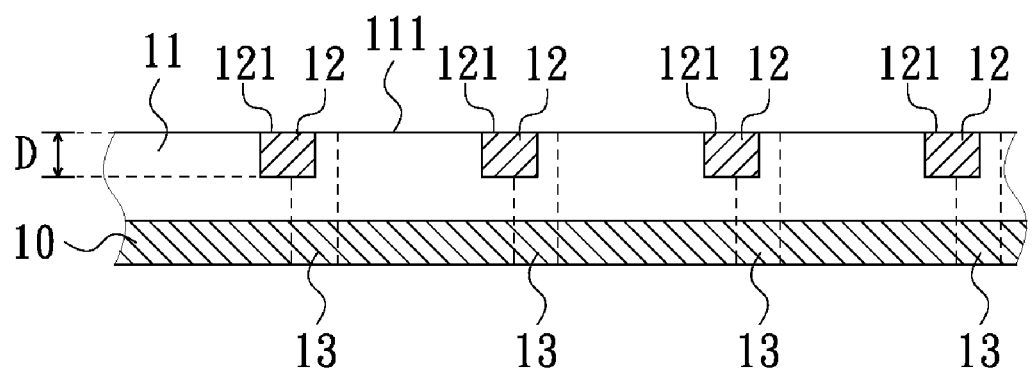
FIG. 1A illustrates a cross-sectional view of a semiconductor chip group in accordance with an embodiment of the present invention.

FIGS. 1A to 1I illustrate a process flow of packaging a number of semiconductor chips to form a semiconductor chip structure in accordance with an embodiment of the present invention. The semiconductor chips can be, but not limited to, selected from a group consisting of a memory chip, a logic circuit chip and a light emitting diode chip. FIG. 1A illustrates a cross-sectional view of a semiconductor chip group in accordance with an embodiment of the present invention. Referring to FIG. 1A, at first, a semiconductor chip group is formed. In the present embodiment, a component layer 11 is disposed on a substrate 10. The component layer 11 is a multiple layer structure and includes, for example, a number of electronic components, a number of conductive wire layers and a number of dielectric layers. The component layer 11 is shown simply and the detail structure is not shown in the FIGS. 1A to 1I. The component layer 11 has a first surface 111 (i.e., an uppermost top surface). A number of conductor units 12 are disposed in the component layer 11. Each of the conductor units 12 has a first bonding surface 121. Each of the conductor units 12 is exposed from the first surface 111. That is, the first bonding surface 121 is exposed from the first surface 111. The conductor units 12 are configured for serving as pads to electrically connect the electronic components in the component layer 11 to an outside component. A thickness D of each of the conductor units 12 can be more than 10000 nanometers.

Figure 1B:
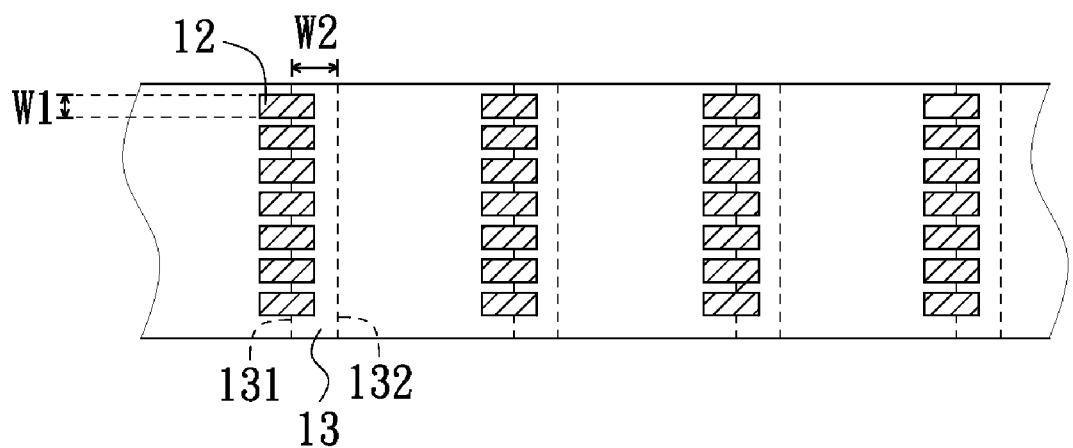
FIG. 1B illustrates a top view of the semiconductor chip group shown in FIG. 1A.

FIG. 1B illustrates a top view of the semiconductor chip group shown in FIG. 1A. A number of notch regions 13 are defined on the first surface 111, thereby defining a semiconductor chip unit between two adjacent notch regions 13. Each of the notch regions 13 includes two scribe lines 131, 132 on two opposite sides thereof. In the present embodiment, each semiconductor chip unit includes a number of the conductor units 12. The conductor units 12 of each semiconductor chip unit have an identical size and are arranged with an identical space. It is noted that, in another embodiment, each semiconductor chip unit can only include one of the conductor units 12. A portion of each of the conductor units 12 of each semiconductor chip unit is located in the corresponding notch region 13. That is, at least the corresponding scribe line 131 passes through the conductor units 12 of each semiconductor chip unit. In the present embodiment, one portion of each of the conductor units 12 of each semiconductor chip unit is located in the corresponding notch region 13, and another portion of each of the conductor units 12 of each semiconductor chip unit is located outside the corresponding notch region 13. In other words, only the corresponding scribe line 131 passes through the conductor units 12 of each semiconductor chip unit. In addition, a width W1 of each of the conductor units 12 of each semiconductor chip unit is in a range from 10 micrometers to 40 micrometers. A width W2 of each of the notch regions 13 is, but not limited to, about 100 micrometers.

Figure 1C:
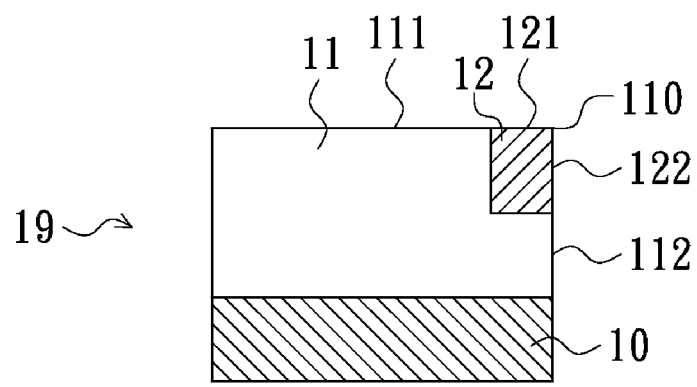
FIG. 1C illustrates a cross-sectional view of a semiconductor chip in accordance with an embodiment of the present invention.
Figure 1D:
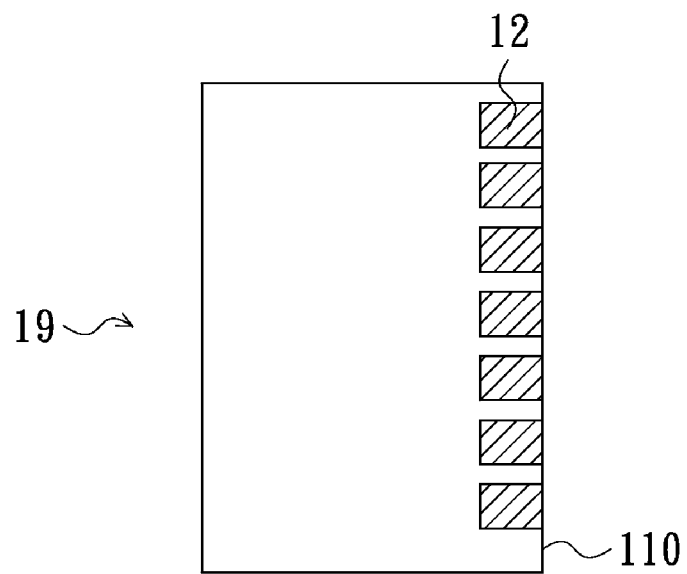
FIG. 1D illustrates a top view of the semiconductor chip shown in FIG. 1C.

FIG. 1C illustrates a cross-sectional view of a semiconductor chip in accordance with an embodiment of the present invention. FIG. 1D illustrates a top view of the semiconductor chip shown in FIG. 1C. Referring to FIGS. 1C and 1D, the semiconductor chip group is cut along the scribe lines 131, 132 of the notch regions 13 so as to form a number of semiconductor chip 19. Due to cutting, the semiconductor chip 19 forms a second surface 112 adjacent to the first surface 111. In other words, due to cutting, the semiconductor chip 19 forms an edge 110, and the second surface 112 and the first surface 111 are respectively on two sides of the edge 110. In the present embodiment, the second surface 112 is perpendicular to the first surface 111. At the same time, during cutting, the conductor units 12 are cut along the corresponding scribe line 131 so that each of the conductor units 12 forms a second bonding surface 122. The second boding surfaces 122 are exposed from the second surface 112. It is noted that, the first surface 111 and the second surface 112 of the semiconductor chip 19 are respectively the first surface and the second surface of the component layer 11 of the semiconductor chip 19. In the present embodiment, the first bonding surface 121 is adjacent to the second bonding surface 122.

Next, at least two of the semiconductor chips 19 (e.g., a first semiconductor chip 191 and a second semiconductor chip 192) are packaged to form a semiconductor chip package structure by using the following processes.

Figure 1E:
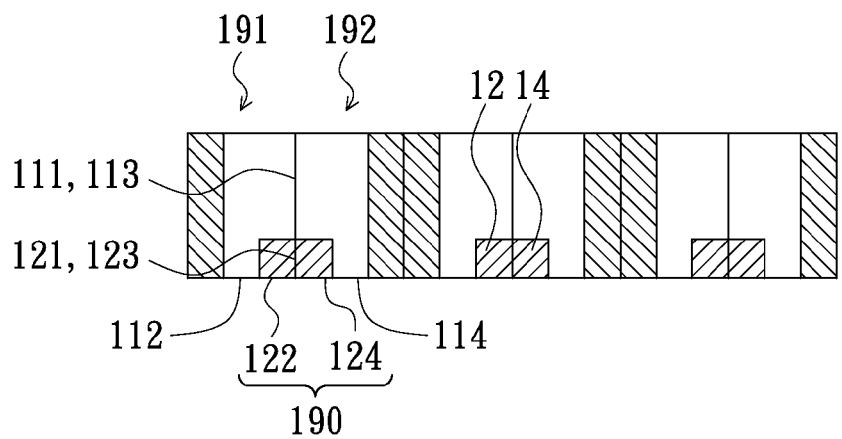
FIG. 1E illustrates a stacked 3-dimensional package structures in accordance with an embodiment of the present invention.

Referring to FIG. 1E, a first surface 111 of the first semiconductor chip 191 is attached to a third surface 113 (similar to the first surface 111 of the first semiconductor chip 191) of the second semiconductor chip 192 so that an exposed first bonding surface 121 of the first semiconductor chip 191 is contacted with and electrically connected to the exposed third bonding surface 123 (similar to the exposed first bonding surface 121 of the first semiconductor chip 191) of the second semiconductor chip 192. For example, either a conductive adhesive or a solder can be used between the exposed first bonding surface 121 and the exposed third bonding surface 123 to achieve electrical connection. Thus, the first semiconductor chip 191 and the second semiconductor chip 192 are stacked together to form a 3-dimensional package structure, and the first conductor unit 12 of the first semiconductor chip 191 and the second conductor unit 14 (similar to first conductor unit 12 of the first semiconductor chip 191) of the second semiconductor chip 192 form a bond pad. Preferably, the second bonding surface 122 of the first semiconductor chip 191 and the fourth bonding surface 124 (similar to the second bonding surface 122 of the first semiconductor chip 191) of the second semiconductor chip 192 form a bonding pad surface 190. That is, the second bonding surface 122 of the first semiconductor chip 191 is level with the fourth bonding surface 124 of the second semiconductor chip 192. As mentioned above, a number of 3-dimensional package structures can be formed. Next, referring to FIG. 1E, the 3-dimensional package structures can be stacked together to form a stacked 3-dimensional package structure. In the present embodiment, the 3-dimensional package structures are arranged in a row.

Figure 1F:
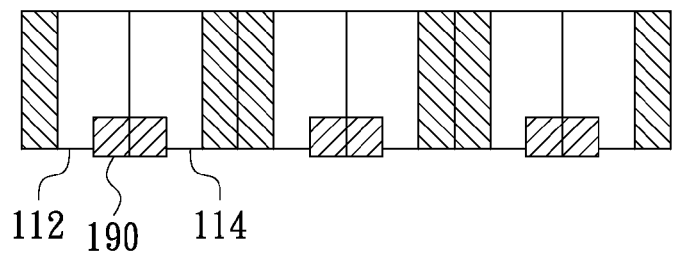
FIG. 1F illustrates a stacked 3-dimensional package structure after an etch back process in accordance with an embodiment of the present invention.

Additionally, referring to FIG. 1F, an etch back process can be optionally performed. Thus, the first conductor units 12 can be protruded from the second surface 112 of the first semiconductor chip 191, and the second conductor units 14 can be protruded from a fourth surface 114 (similar to the second surface 112 of the first semiconductor chip 191) of the second semiconductor chip. In other words, the bonding pad surface 190 is not level with the second surface 112 of the first semiconductor chip 191 and the fourth surface 114 of the second semiconductor chip 192.

Figure 1G:
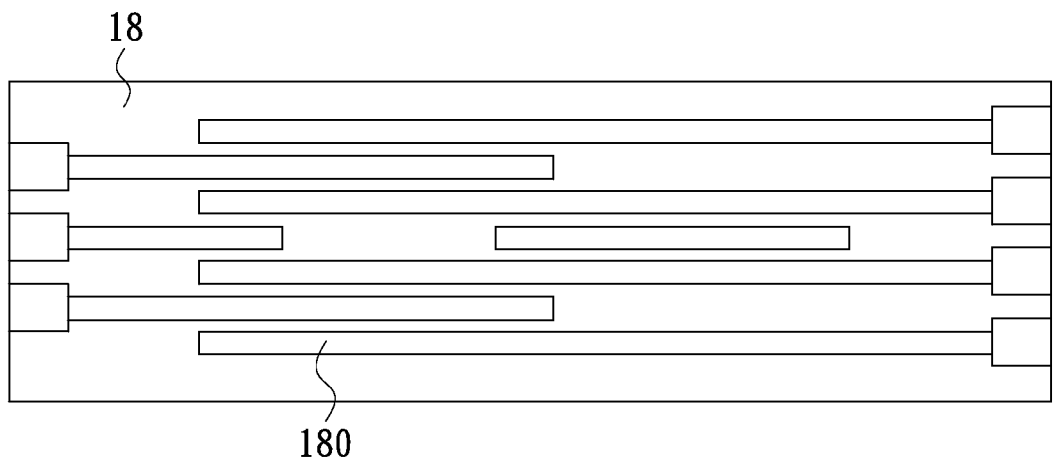
FIG. 1G illustrates a stacked 3-dimensional package structure assembled on a supporting substrate in accordance with an embodiment of the present invention.
Figure 1H:
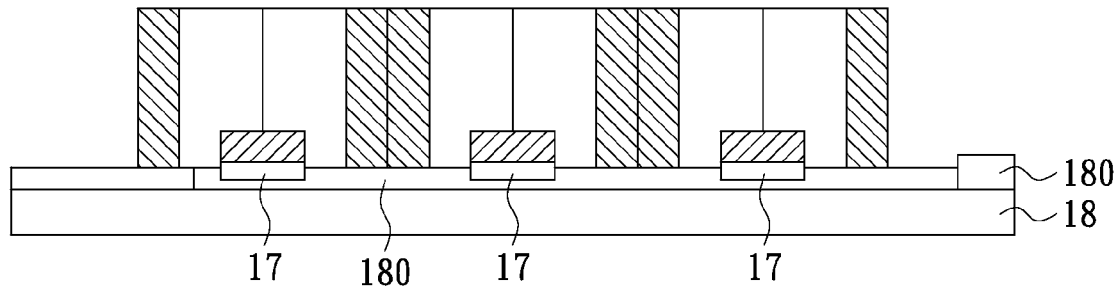
FIG. 1H illustrates a cross-sectional view of a stacked 3-dimensional package structure assembled on a supporting substrate in accordance with an embodiment of the present invention.
Figure 1I:
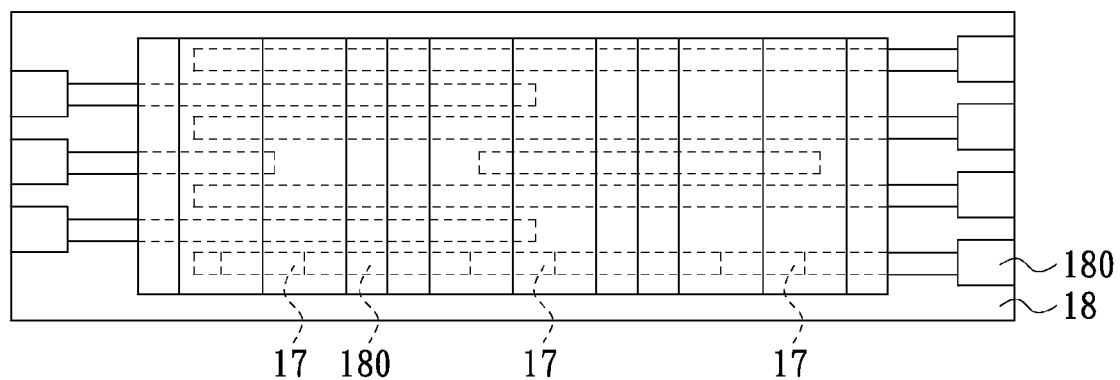
FIG. 1I illustrates a top view of the stacked 3-dimensional package structure assembled on the supporting substrate shown in FIG. 1H.

Next, referring to FIG. 1G, the stacked 3-dimensional package structure is assembled on a supporting substrate 18. The supporting substrate 18 includes a wire unit 180. A line width of the wire unit 180 is in a range from 10 micrometers to 40 micrometers. The line width and the line space of the wire unit 180 correspond to the size and the space of the bonding pads. FIG. 1H illustrates a cross-sectional view of a stacked 3-dimensional package structure assembled on a supporting substrate in accordance with an embodiment of the present invention. FIG. 1I illustrates a top view of the stacked 3-dimensional package structure assembled on the supporting substrate shown in FIG. 1H. Referring to FIGS. 1H and 1I, the stacked 3-dimensional package structure as shown in FIG. 1F is disposed on the supporting substrate 18 so that the wire unit 180 is electrically connected to the bonding pad surface 190 through a solder material 17. It is noted that, if the second bonding surface 122 of the first semiconductor chip 191 is not level with the fourth bonding surface 124 of the second semiconductor chip 192, the wire unit 180 is configured for electrically connecting to at least one of the second bonding surface 122 and the fourth bonding surface 124.

Thus, in the embodiments of the present invention, it is not necessary for the substrate 10 to be thinned. The semiconductor chips can be stacked simply to form a 3-dimensional semiconductor chip package structure. Moreover, the semiconductor chips with different sizes stacked can be stacked simply to form a 3-dimensional semiconductor chip package structure according to the present invention.

Figure 2A:
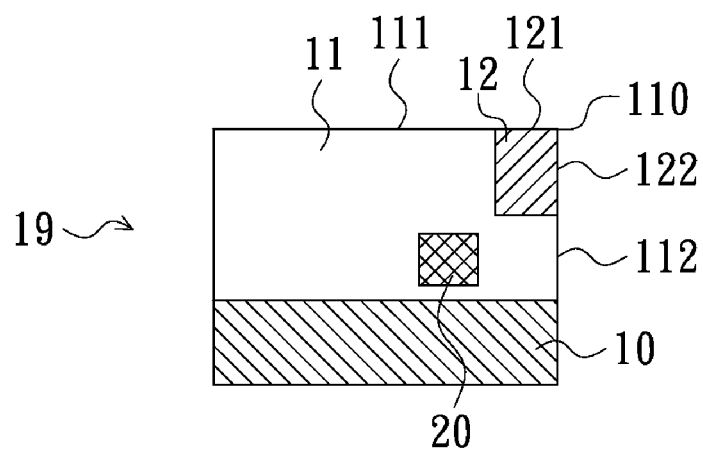
FIG. 2A illustrates a cross-sectional view of a semiconductor chip in accordance with another embodiment of the present invention.

Additionally, referring to FIG. 2A, in another embodiment, the semiconductor chip 19 can further includes a sealing ring 20. The sealing ring 20 is not formed by a pad metal layer so that the conductor units 12 can give the sealing ring 20 a miss to exposed from the semiconductor chip 19. For example, the sealing ring 20 can be formed by electrically conductive layer disposed in the component layer 11 and located between the conductor units 12 and the substrate 10. For another example, the sealing ring 20 can define a cut through which the conductor units 12 pass.

Figure 2B:
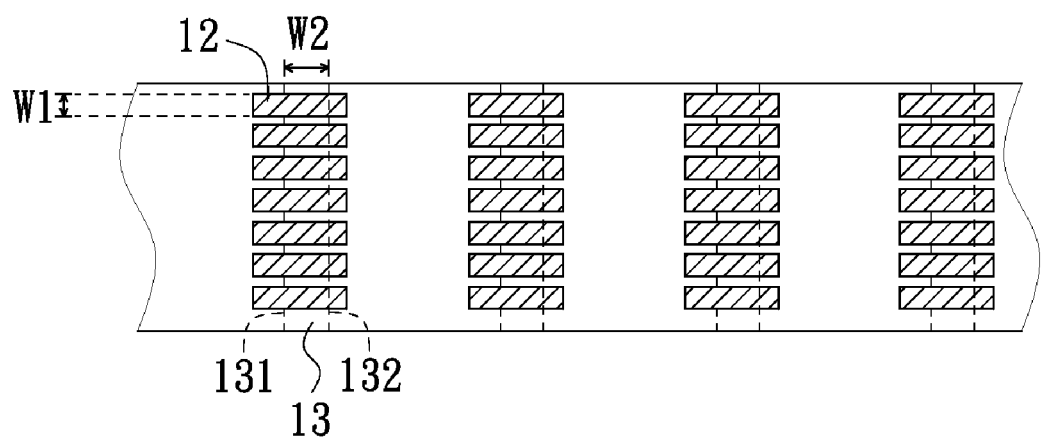
FIG. 2B illustrates a top view of the semiconductor chip group shown in accordance with another embodiment of the present invention.

Additionally, referring to FIG. 2B, in another embodiment, each of the conductor units 12 of each semiconductor chip unit can traverses the corresponding notch region 13. That is, both the corresponding scribe lines 131, 132 pass through the conductor units 12 of each semiconductor chip unit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor chip package structure, comprising:
a first semiconductor chip comprising at least a first conductor unit, the first conductor unit having a first bonding surface and a second bonding surface, the first bonding surface and the second bonding surface being exposed from the first semiconductor chip;
a second semiconductor chip comprising at least a second conductor unit, the second conductor unit having a third bonding surface and a fourth bonding surface, the third bonding surface and the fourth bonding surface being exposed from the second semiconductor chip, wherein the third bonding surface is contacted with and electrically connected to the first bonding surface; and
a supporting substrate comprising a wire unit for electrically connecting to at least one of the second bonding surface and the fourth bonding surface;
wherein the first semiconductor chip comprises a first substrate and a first component layer disposed on the first substrate, the first conductor unit is disposed in the first component layer, the second semiconductor chip comprises a second substrate and a second component layer disposed on the second substrate, and the second conductor unit is disposed in the second component layer.

2. The semiconductor chip package structure as claimed in claim 1, wherein the first semiconductor chip and the second semiconductor chip are selected from a group consisting of a memory chip, a logic circuit chip and a light emitting diode chip.

3. The semiconductor chip package structure as claimed in claim 1, wherein the first semiconductor chip comprises a first surface and a second surface adjacent to and perpendicular to the first surface, the first bonding surface and the second bonding surface are respectively exposed from the first surface and the second surface, the second semiconductor chip comprises a third surface and a fourth surface adjacent to and perpendicular to the third surface, and the third bonding surface and the fourth bonding surface are respectively exposed from the third surface and the fourth surface.

4. The semiconductor chip package structure as claimed in claim 3, wherein the first conductor unit is protruded from the second surface of the first semiconductor chip, and the second conductor unit is protruded from the fourth surface of the second semiconductor chip.

5. The semiconductor chip package structure as claimed in claim 1, wherein the supporting substrate is a silicon substrate.

6. The semiconductor chip package structure as claimed in claim 1, wherein the second bonding surface and the fourth bonding surface form a bonding pad surface, and the bonding pad surface is soldered with and electrically connected to the wire unit.

7. A semiconductor chip, comprising:
a substrate;
a component layer disposed on the substrate, the component layer having a first surface and a second surface adjacent to and perpendicular to the first surface; and
a conductor unit disposed in the component layer, the conductor unit having a first bonding surface exposed from the first surface and a second bonding surface exposed from the second surface.

8. The semiconductor chip as claimed in claim 7, wherein the semiconductor chip is selected from a group consisting of a memory chip, a logic circuit chip and a light emitting diode chip.

9. The semiconductor chip as claimed in claim 7, wherein the first bonding surface is adjacent to the second bonding surface.

10. The semiconductor chip as claimed in claim 7, wherein the conductor unit is protruded from the second surface.

11. The semiconductor chip as claimed in claim 7, further comprising a sealing ring disposed in the component layer and located between the conductor unit and the substrate.

12. A semiconductor chip group, comprising:
a substrate;
a component layer disposed on the substrate, the component layer having a first surface, the first surface being an uppermost top surface of the component layer, a plurality of notch regions being defined on the first surface; and
a plurality of conductor units disposed in the component layer and exposed from the first surface, each of the conductor units having a first bonding surface, a portion of the conductor units being located in the corresponding notch region.

13. The semiconductor chip group as claimed in claim 12, wherein each of the conductor units traverses the corresponding notch region.

* * * * *